United States Patent [19]

Allen et al.

[11] Patent Number: 6,020,785
[45] Date of Patent: Feb. 1, 2000

[54] FIXED GAIN OPERATIONAL AMPLIFIERS

[75] Inventors: Charles M. Allen, Sunnyvale, Calif.; Robert St. Pierre, Tuscon, Ariz.

[73] Assignees: Maxim Integrated Products, Inc., Sunnyvale, Calif.; Gain Technology Corporation, Tucson, Ariz.

[21] Appl. No.: 09/252,317

[22] Filed: Feb. 18, 1999

Related U.S. Application Data

[63] Continuation of application No. 09/177,926, Oct. 23, 1998, abandoned.

[51] Int. Cl.[7] .............................. G01R 19/00; H03G 3/20
[52] U.S. Cl. ................................. 330/2; 330/129
[58] Field of Search ....................... 330/129, 254, 330/278, 307, 2; 327/359

[56] References Cited

U.S. PATENT DOCUMENTS

| | | | |
|---|---|---|---|
| 4,292,596 | 9/1981 | Ishizuka et al. | 330/254 |
| 4,441,082 | 4/1984 | Haque | 330/129 |
| 4,691,172 | 9/1987 | Fukahori et al. | 330/129 |
| 5,563,549 | 10/1996 | Shieh | 327/543 |
| 5,642,075 | 6/1997 | Bell | 330/129 |
| 5,877,612 | 3/1999 | Straw | 330/254 |

OTHER PUBLICATIONS

National Semiconductor Corporation, "LH0084/LH0084C Digitally–Programmable–Gain Instrumentation Amplifier," Linear Databook (1982), pp. 4–37–4–48.

*Primary Examiner*—Robert Pascal
*Assistant Examiner*—Patricia T. Nguyen
*Attorney, Agent, or Firm*—Blakely, Sokoloff, Taylor & Zafman LLP

[57] ABSTRACT

A method and apparatus for customizing the gain of a closed loop operational amplifier during fabrication to a fixed value. The fabricated circuit includes a feedback resistance and a gain resistance coupled to an operational amplifier core. The feedback resistance is set to a preset value by setting links coupled to resistors which make up the feedback resistance.

23 Claims, 14 Drawing Sheets

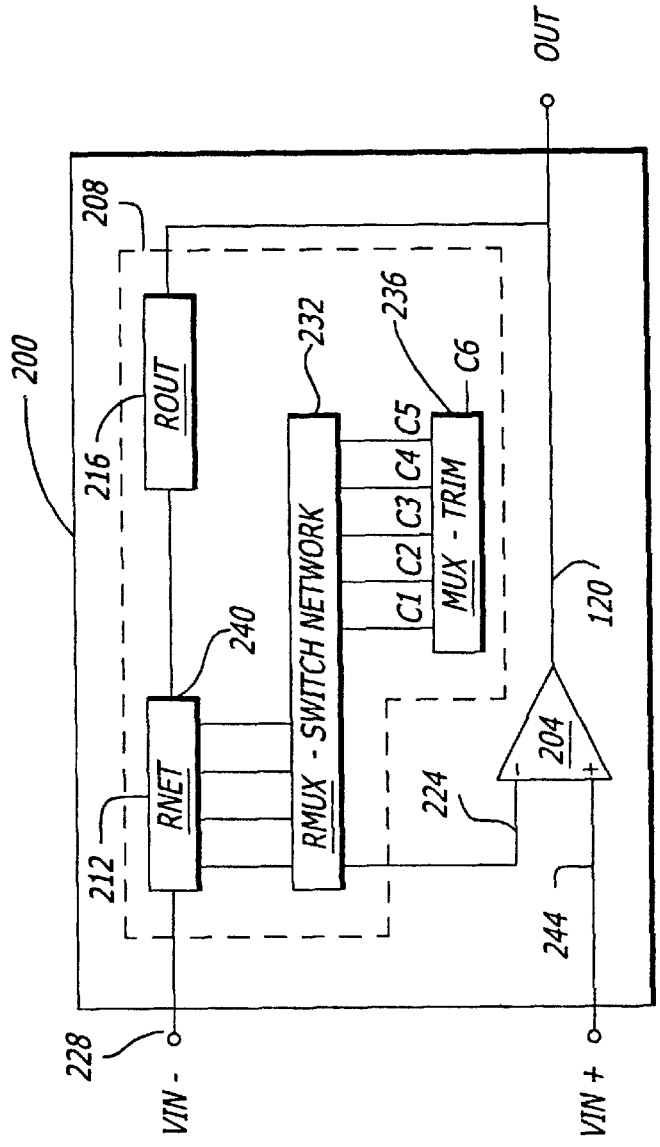
*FIG. 2A*
*FIG. 2B*
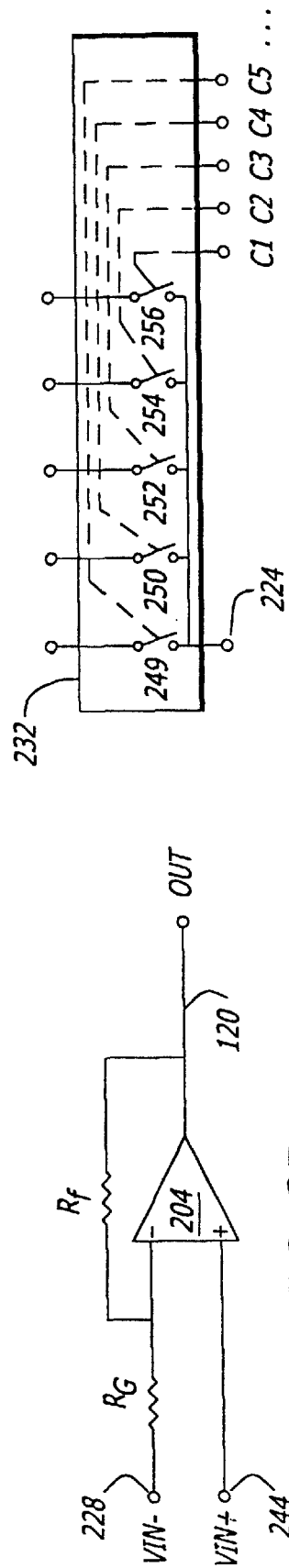
*FIG. 2C*

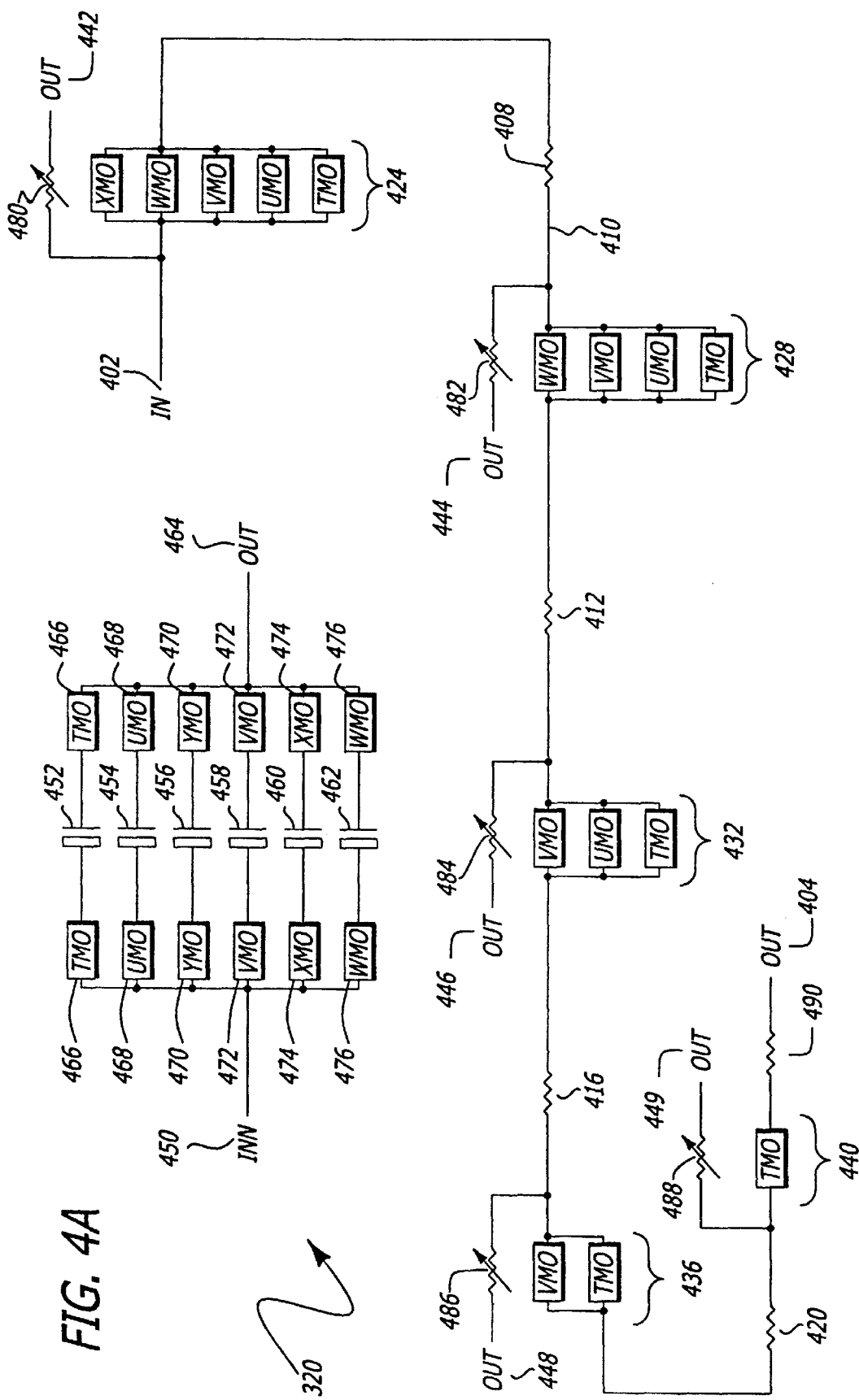

FIXED GAIN OPERATIONAL AMPLIFIERS

CROSS-REFERENCE TO RELATED APPLICATION

This application is a continuation of U.S. patent application Ser. No. 09/177,926, which was filed Oct. 23, 1998 and is now abandoned.

BACKGROUND OF THE INVENTION

1. Field of the Invention

This invention relates to amplifier circuits. In particular, the invention describes a system to incorporate an operational amplifier and a feedback loop on a single silicon chip.

2. Description of Related Art

Networks (including resistive, capacitive, inductive, and currents source networks) are commonly used in analog integrated circuits. For example, resistive networks are commonly used to provide desired reference voltage levels. Resistive elements are formed on integrated circuits and are thus subject to process variations inherent in integrated circuit manufacturing processes. Within a typical process, the resistance of a given resistive element may deviate from a desired resistance by plus or minus five percent. In some applications, such large deviations are unacceptable. To obtain tighter tolerances, prior art references "trim" resistive circuits by setting "links" to vary resistive parameters.

Trimming is typically performed by a trim circuit coupled to a resistive network. The trim circuit creates a trim signal which controls switches within the resistive network. An ohm meter measures the resistance of the resistive network while a control signal opens and closes switches to determine how much trimming is desirable to achieve a desired resistance.

Various methods of trimming the resistor network are described in prior art references and illustrated in FIGS. 1A and 1B. In one embodiment, a trimming is accomplished by directing a laser beam 104 at the "sandwich" structure 108 of a target resistor element 112. The laser beam 104 does not vaporize materials at the point of contact but causes a recrystallization and scattering of atoms which programs the target resistor element 112 into a high resistance state. In one embodiment, the changing of the resistance value is several orders of magnitude to simulate the operation of a switch.

Another method of trimming a resister utilizes an anti-fuse resistive element 150 which includes a bottom conductive layer 152, an oxide layer 154 provided with a hole 156, and an upper conductive layer 158. The hole may be filled with an anti-fuse material 160 such as amorphous silicon. Prior to programming, the anti-fuse resistive element 150 approximates an open circuit. The anti-fuse resistive element 150 may be programmed using a large voltage potential which causes conductive pathways to form through the anti-fuse material lowering the resistance of resistive element 150.

Other methods of trimming a resistive network are described in the prior art reference, *Low Powertrim Circuit and Method*, U.S. Pat. No. 5,563,549, by Sui Shieh.

Operational amplifiers are often connected to resistor networks to adjust the closed loop gain of an amplifier circuit. However, current methods of adjusting a resistor network and connecting the resistor network to the operational amplifier are inaccurate, and require additional packaging. In addition, varying resistive parameters to achieve a desired gain often results in a poor frequency response of the amplifier circuit. Thus, a more efficient method and apparatus for producing an op-amp circuit with a resistive network is needed.

SUMMARY OF THE INVENTION

A closed loop fixed gain operational amplifier circuit and a method for fabricating the circuit on a chip is described. The circuit includes an operational amplifier core. A gain network which may include resistors, capacitors and inductors to couple an output of the operational amplifier core to the inputs of the operational amplifier core. The gain network is adjusted to set the circuit to a fixed gain prior to packaging of the chip in an integrated circuit package. In one embodiment of the invention, capacitive elements in the gain network and amplifier are also set to optimize the frequency response of the amplifier circuit.

BRIEF DESCRIPTION OF THE DRAWINGS

FIG. 2A illustrates a block diagram view of an operational amplifier core (op-amp) core with a gain control network. FIGS. 2B and 2C illustrate simplified circuit views to illustrate the operation of the circuit of FIG. 2A.

FIGS. 4A and 4B illustrate a resistive network (ROUT) for use in the circuit of FIGS. 3A–3B.

DETAILED DESCRIPTION

Figure 1A:
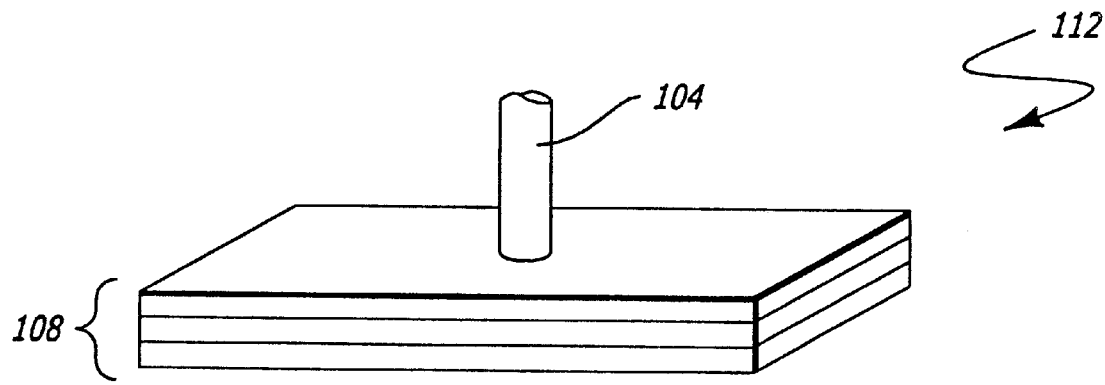
FIG. 1A and FIG. 1B illustrate prior art methods of trimming a resistor.
Figure 1B:
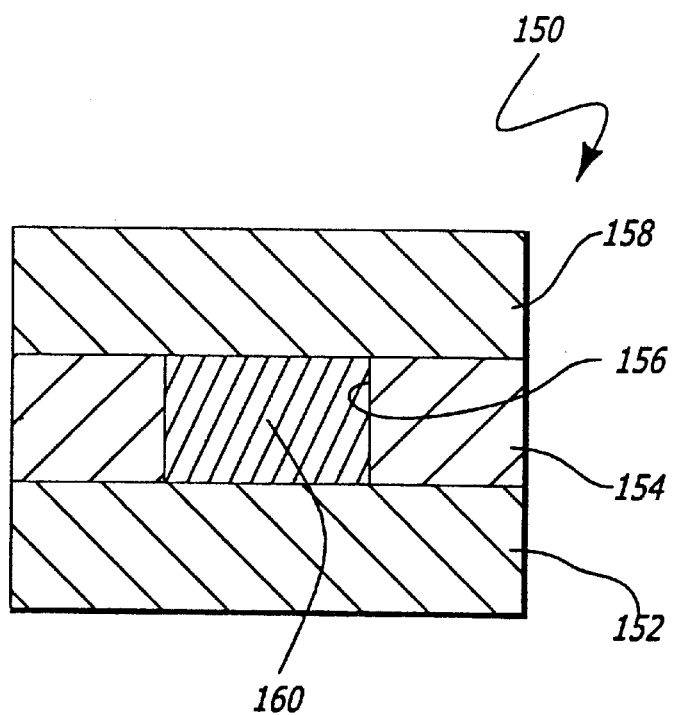

The present invention relates to a circuit and a method for fabricating a circuit including a fixed gain operational amplifier circuit fabricated on a semiconductor chip. The invention utilizes trim or metallization techniques to set resistances and capacitances in a gain control network to predetermined values. The metallization process of the gain control network occurs during semiconductor processing. The trimming of the gain control network may occur after semiconductor processing. The setting of the resistances in the gain control network sets the closed loop gain of the fixed gain operational amplifier to a predetermined value. The setting of capacitances in the gain control network as well as in an operational amplifier core improves the frequency response of the fixed gain operational amplifier. In one embodiment, the gain network may also include a multiplexer trim circuit to further set the gain of the fixed gain operational amplifier circuit.

In the following description, various details will be given, such as detailed circuit schematics describing the operational amplifier core, various resistor networks, the multiplexer trim network and various other parameters used in the invention. These details, as well as others, are given to facilitate understanding of the invention and are not intended to limit the invention.

Principles of Operation

FIG. 2A illustrates a fixed gain operational amplifier circuit 200. In one embodiment of the invention, the circuit 200 is formed on a semiconductor chip. The fixed gain operational amplifier circuit 200 includes an operational amplifier core (op-amp core) 204 and an associated gain control network 208.

The gain control network 208 includes a resistor network (ROUT) 216 coupled in series with a second resistor network (RNET) 212. It is to be understood that a "resistor network" may include other circuit elements besides resistors. In one embodiment of the invention, the resistor networks ROUT 216 includes a plurality of capacitors which may be added or removed from various circuit paths in order to compensate for on-chip parasitics.

In one embodiment of the invention, network RNET 212 and ROUT 216 include a plurality of links, often implemented as metal options for setting gain ranges and bandwidth compensation, coupling the capacitive and resistive elements. By adjusting the links in RNET 212, the resistance of RNET 212 can be adjusted to set the desired closed loop gain of the fixed gain operational feedback amplifier 200 while the capacitive elements can be set to achieve a desired frequency response.

FIG. 2B illustrates the operation of the networks RNET 212 and ROUT 216 of FIG. 2A. In FIG. 2B, an op-amp core 204 is coupled to an effective feedback resistance $R_f$ coupled between a negative input to the op-amp core and the output of the op-amp core. A second resistance, an effective gain setting resistance, $R_G$ is coupled between the negative input to the op-amp core and an input terminal 228 of the fixed gain operational amplifier. The gain of the circuit of FIG. 2B is defined by $-R_f/R_G$. In alternate embodiments, the positive terminal of the op-amp core is driven resulting in a gain of $A_V=1+R_f/R_G$. By adjusting the feedback resistance and the gain resistance, the gain of the circuit of FIG. 2B can be changed.

The circuit of FIG. 2A provides block diagram details of the circuit of FIG. 2B. In particular, in FIG. 2A, the effective feedback resistance $R_f$ is the resistance of resistor network ROUT 216 added to some of the resistors in resistor network RNET 212. The effective gain resistance $R_G$ is the resistance of an electrical path between VIN− 228 and an input 224 to op-amp core 204 through RNET 212.

In one embodiment of the invention, the effective gain resistance is determined by (1) link settings in RNET 212, (2) the effective electrical path through RNET 212, and (3) an input trim network set for gain accuracy. The electrical path through RNET 212 is determined by a switch network RMUX 232. By opening and closing switches, the RMUX switch network 232 may be set by a multiplexer, MUX 236, to determine the electrical path between a circuit input 228 and an op-amp core input 224. By selecting the electrical path through RNET 212, the effective gain resistance and feedback resistance can be selected.

The effective feedback resistance is changed by three factors comprising (1) setting links in ROUT 216, (2) setting links in RNET 212, and (3) using RMUX 232 to select an electrical path from a terminal 240 of RNET 212 to op-amp core input 224. In addition, output trim networks are used to set gain accuracy.

The gain of fixed gain operational amplifier circuit 200 is determined by the resulting effective feedback resistance and the effective gain resistance. When a positive input 244 to op-amp core 204 is grounded, the gain of the fixed gain operational amplifier 200 is determined by Gain=negative of the effective feedback resistance divided by the effective gain resistance. When the negative inputs is grounded, the gain $A_V=(1+R_f/R_G)$.

FIG. 2C illustrates the functional operation of the RMUX switch network 232. A plurality of switches 250, 252, 254, 256 couple the RNET 212 to the op-amp core input 224. The output of the multiplier circuit (MUX) along lines C1, C2, C3, C4, C5 determine the setting of the switches. It is recognized that five lines is an example embodiment, in alternative embodiments, n lines may be used where n is a positive integer. The switch settings determine the electrical path through RNET 212 and thus the effective gain and feedback resistances. The setting of line C6 determines the V/2 bias on the positive input of the op-amp core.

Figure 3A:
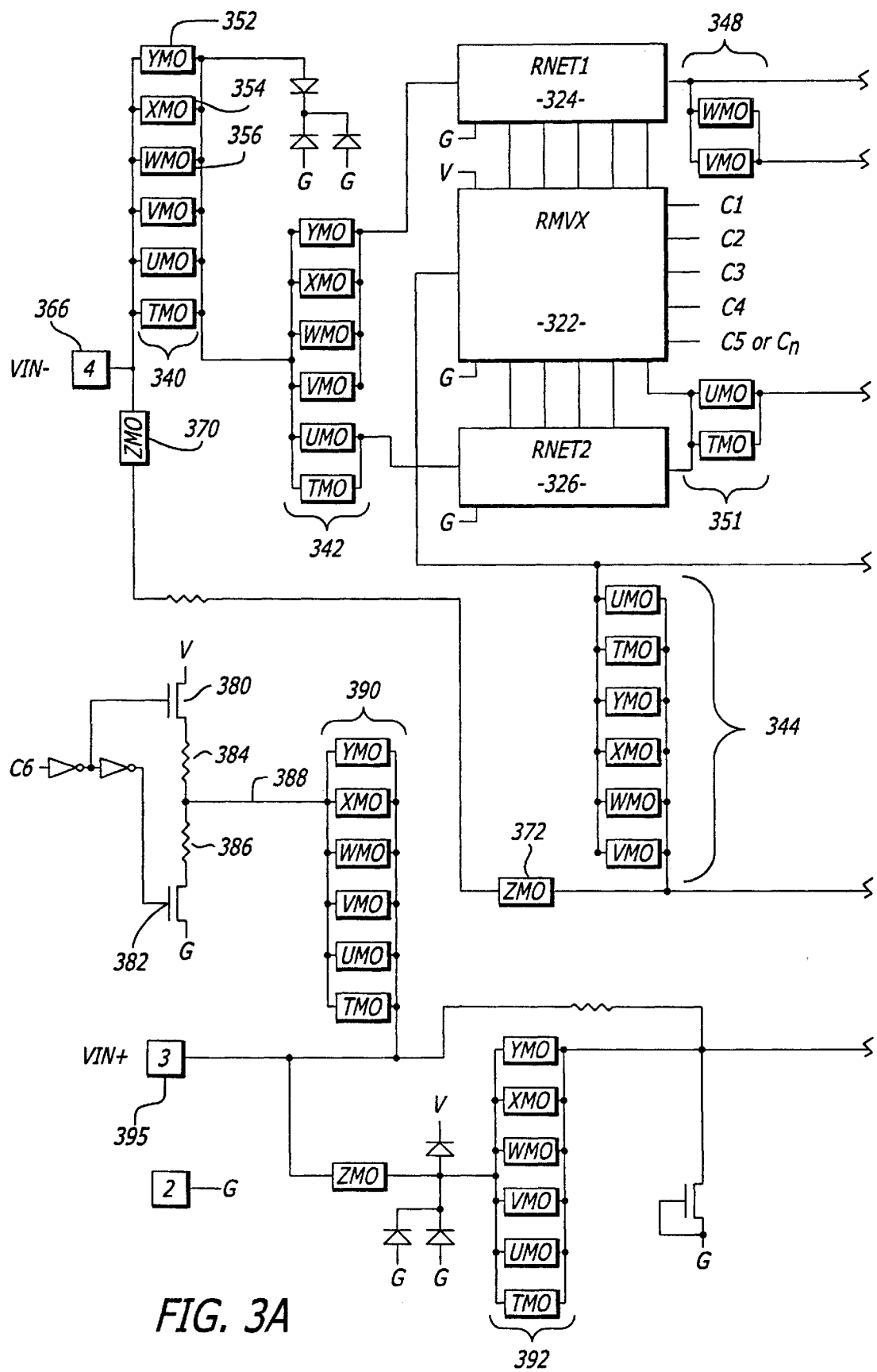
FIGS. 3A and 3B illustrate one implementation of a circuit level diagram of a fixed gain operational amplifier including a gain control network, an op-amp core and bias circuitry.
Figure 3B:
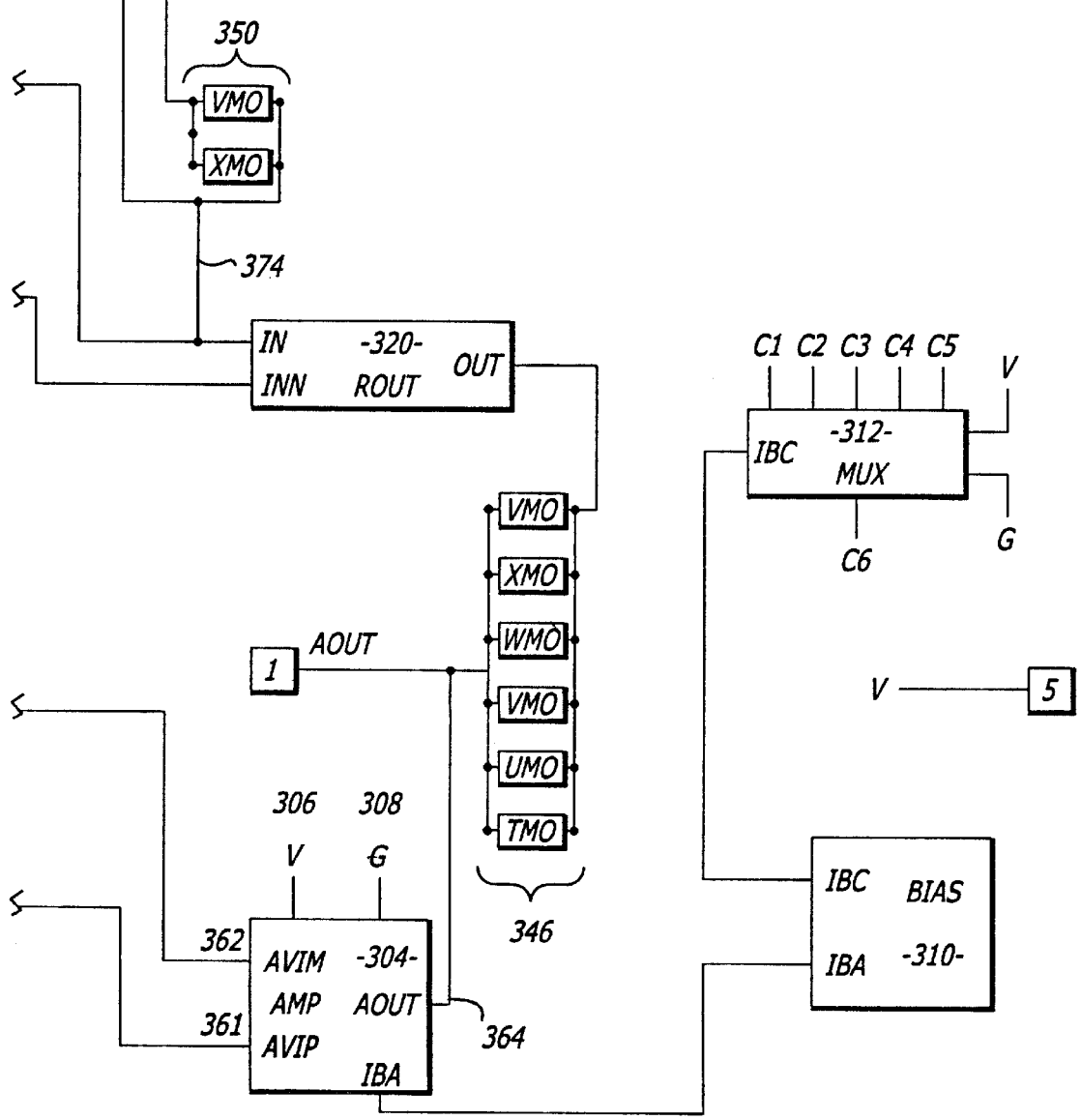

FIGS. 3A–3B illustrate one implementation of the fixed gain operational amplifier circuit 200 of FIG. 2A. The fixed gain operation amplifier circuit 300 of FIGS. 3A–3B illustrates the connections between an op-amp core 304 and supporting electronics as well as the elements of a gain control network. The supporting electronics includes power supply signals transmitted on voltage input line 306 and ground line 308. Bias circuit 310 provides a bias signal to op-amp core 304. The bias circuit 310 also provides bias signals for multiplexer circuit (MUX) 312. The circuit implementations of bias circuit 310 is well understood by those of ordinary skill in the art and may be implemented using a number of designs.

The gain control network 208 of FIG. 2A is implemented in circuit 300 of FIGS. 3A–3B using a network of resistors and capacitors in network ROUT 320, a switch network RMUX 322, and two additional networks RNET1 324, RNET2 326 and MUX 312. Multiplexer, MUX 312 controls the switches in switch network RMUX 322. The gain control network also includes a plurality of link sets 340, 342, 344, 346, 348, 350, 351 to couple the elements of the gain control circuit.

Each link set includes at least one link such as links 352, 354, 356 of link set 340. Each link 352, 356 is individually identified by initials such as YMO for link 352 XMO for link 354 and WMO for link 356. These links are connected and disconnected depending on the desired gain range of circuit 300. The closing and opening of links may be determined by reviewing table 368. For example, when the op-amp gain range is predetermined to be approximately 2.5 to 4 volts, corresponding to row 373, the XMO link such as XMO link 354 are connected. While XMO is connected, links corresponding to other links in the table such as YMO, WMO and VMO are disconnected.

Setting of the links is done during the fabrication of the circuit 300. In one embodiment, selected links may be set during the metallization process by creating a metal contact only at the selected predetermined links during the semiconductor processing of circuit 300. In alternative embodiments, the links are antifuse resistors as described in the description of related art and in U.S. Pat. No. 5,563,549 by Sui Shieh and assigned to the assignee of the present invention. The Shieh reference is hereby incorporated by reference. Other methods of opening and closing links during the semiconductor fabrication process are known to those of skill in the art.

In one embodiment of the invention, setting (opening or closing) of the links is done during fabrication of circuit 300 on a silicon chip and prior to packaging of the silicon chip in an integrated circuit package. The integrated circuit package may be a ceramic or plastic packaging encasing a single silicon chip. When laser trimming is used to open or close links, the laser trim process may be conducted during the wafer sort process. Other links described in the remainder of the application may also be set using the described techniques of metallization and/or laser trimming.

A positive input (VIN+) 395 of circuit 300 is coupled to a positive input 361 of op-amp core 304. The op-amp core 304 amplifies differential signals between positive input 361 and a negative input 362 to the op-amp core 304. The positive input (VIN+) 395 of circuit 300 will typically be grounded such that the signal to be amplified is the signal applied to a negative input terminal (VIN−) 366 of circuit 300. Alternatively, the negative input terminal (VIN−) 366 can be grounded and an input signal applied to positive input terminal (VIN+) 395.

In one specific embodiment of the invention, a bias network is coupled to the positive input 361 of Op-Amp core 304. The bias circuit is controlled by the C6 output of MUX 312. When C6 is high, transistors 380, 382 are on and resistors 384, 386 act as a voltage divider such that when the resistance of resistor 384 equals the resistance of resistor 386, the voltage at node 388 is half the supply voltage "V". When at least one link in link set 390 is closed, and positive input terminal (VIN+) 395 is not grounded, coupled to a load, or an input source, the approximate voltage at node 388 is applied to the positive input of op-amp core 304.

Table 368 of FIG. 3B indicates the metallization options for various gains. Thus, when unity gain or a stable open loop amplifier is desired as shown in line 372 of table 368, the ZMO links are closed and the input 366 to circuit 300 is coupled directly to the input 362 of op-amp core 304. When an open loop amplifier is not desired. ZMO links 370, 372 are open and the input signal on input 366 propagates through a gain control network. More specifically, an input signal on input 366 propagates through link set 340 and link set 342 to resistor networks RNET1 324 or RNET2 depending on the gain range. A similar network 326 is illustrated for selecting gains at other values corresponding to links labeled UMO and TMO. When either link UMO or link TMO is set in link set 351, RNET2 326 is coupled in the feedback loop instead of RNET1 324. RNET2 326 has smaller resistance values than RNET1 324 resulting in larger gains. However, the principles of operation of circuit elements controlled by links labeled UMO and TMO will be similar to the operation of circuit elements in RNET1 324 and, thus, clear to someone of ordinary skill in the art once the operation of the first network RNET1 324 is described.

After passing through link set 342, the input signal enters RNET1 324. A multiplexer MUX 312 selects an electric signal path through RMUX 322 and thereby selects a signal path through RNET1 324. The input signal from input 366 is output by RNET1 324 along lines R1A, R1B, R1C, R1D, or R1E connecting RNET1 324 to the switch network RMUX 322. The resistance of the signal path through RNET1 324 is equivalent to the effective gain resistance as described in FIG. 2B. An INN terminal of RMUX 322 is coupled to the input terminal 362 of op-amp core 304 through link set 344.

The gain control network also includes a feedback network that simulates the resistor feedback $R_f$ of FIG. 2B. In the feedback network, the output signal from the output terminal 364 of op-amp core 304 is transferred through link set 346 to the resistor network ROUT 320. The output signal from op-amp core 304 passes through ROUT 320 to line 374. All non-open loop gain options in table 368 include at least one closed link in link sets 348, 350 or 351 to connect ROUT 320 to RNET1 324 or RNET2 326. The op-amp core 304 output signal thus propagates through a second circuit path in RNET1 324 and through a connection between RNET1 324 and multiplexer switch network RMUX 322 along one selected line R1A, R1B, R1C, R1D, or R1E. From the INN terminal of RMUX 322, the output signal of the op-amp core 304 is fed back to the input terminal 362 of op-amp core 304. Thus, the effective feedback resistance is the sum of the resistance through ROUT added to the resistance of the second circuit path in RNET1 324.

In one embodiment of the invention, the multiplexer MUX 312 determines the circuit path chosen through RNET1 324. MUX 312 controls RMUX 322 through lines C1, C2, C3, C4, C5. By laser trimming the resistors in MUX 312, RNET1 324, ROUT 320 and RMUX 322, the gain of circuit 300 can be set during processing and wafer level sort. In the following figures, detailed circuit descriptions describing an implementation of RMUX 322, RNET1 324, ROUT 320 and MUX 312 will be provided.

Figure 4B:
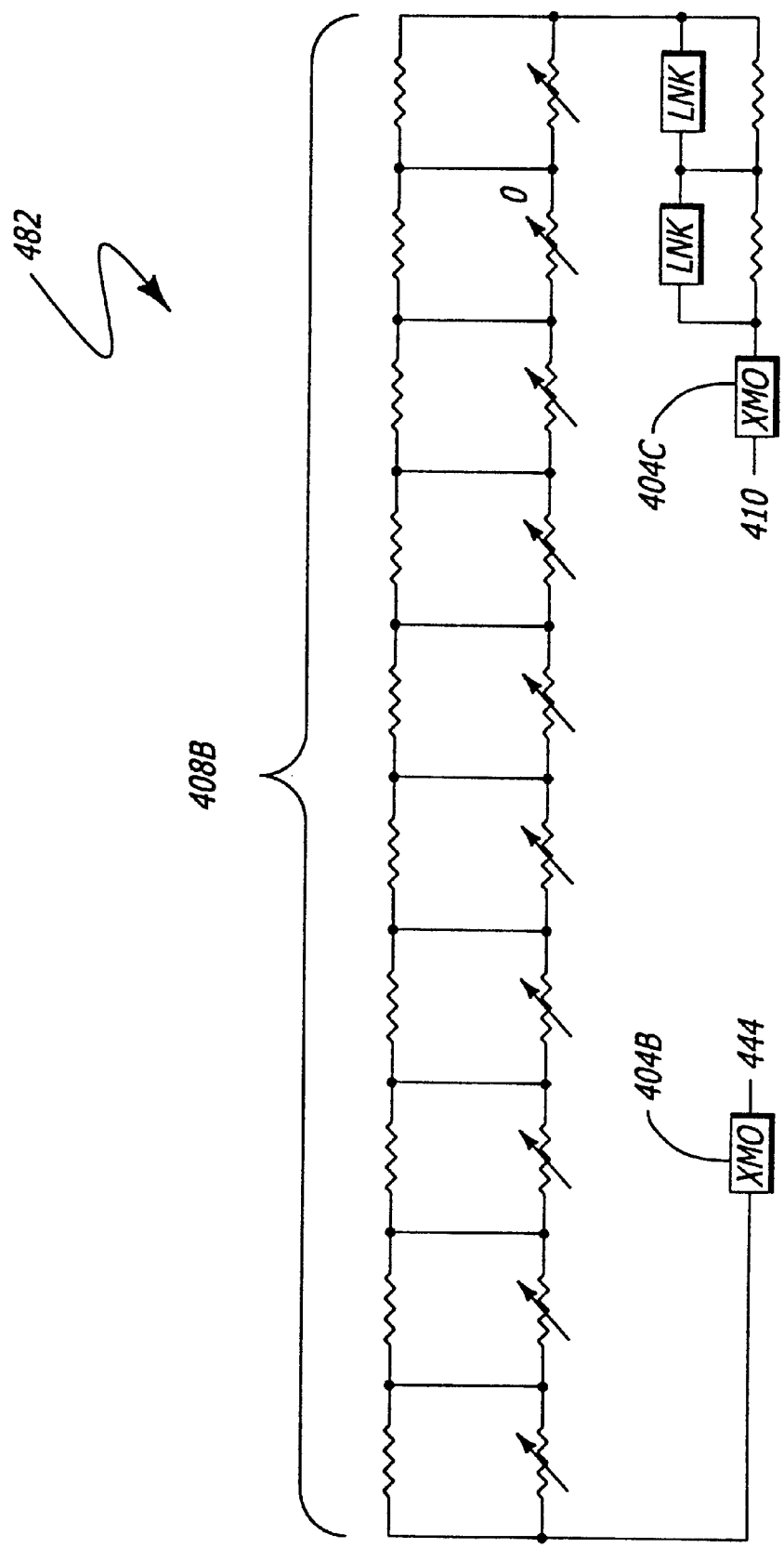

FIGS. 4A–4B comprise a detailed circuit schematic illustrating an implementation of ROUT circuit 320. ROUT circuit 320 includes a series of resistor components to connect between the input terminal IN of ROUT 320 and the output OUT of ROUT circuit 320. Between input terminal IN 402 of the ROUT circuit 320 and alternate output terminal 404 is a series of resistor sets 408, 412, 416 and 420 separated by link sets 424, 428, 432, 436, 440. Additional alternate output terminals 442, 444, 446, 448, 449, 404 are provided adjacent to each link set. The alternate output terminals 442, 444, 446, 448, 449 may be electrically connected to output OUT of ROUT circuit 320. Alternate output terminal 442 allows for connection of input terminal 402 to the output OUT of ROUT circuit 320 through resistor 480 when all links in the link set 424 are open. Which link set of the link sets 424, 428, 432, 436, 440 that includes at least one closed link determines the resistance between input terminal 402 and output OUT of ROUT circuit 320. Only one alternate output terminal OUT 442, 444, 446, 448, 449, or 404 of the series of resistor sets is electrically connected to output OUT of ROUT circuit 320.

Trimmable resistors 480, 482, 484, 486, 488, 490 couple alternate output terminals 442, 444, 446, 448, 449, 404 respectively to the remainder of ROUT 320. In one embodiment, trimmable resistors 480, 482, 484, 486, 490, 488 include two components, a pure trimmable resistive component which allows adjustment of the resistance and a link component which allows opening and closing of the resistor.

FIG. 4B illustrates an example of one of the trimmable resistors, trimmable resistor 482. Setting of trimmable resistor 482 is best understood by way of example. When a gain corresponding to an XMO option is chosen, the XMO link in link set 424 of FIG. 4A is shorted. Link 404B and link 404C of FIG. 4B are also shorted to connect input 402 to output 444 through link set 424, resistor 408 and trimmable resistor 482. In which case, links in trimmable resistors 480, 484, 486, 488 and 490 are set such that alternate outputs 442, 446, 448, 449 and 404 of FIG. 4A are not coupled to input 402.

In FIG. 4B, trimmable resistor 482 includes metal links, 404B, 404C coupled in series with a ladder network of adjustable resistors 408B. Trimming of the adjustable resistors 408B using laser or other techniques allows fine tuning of the gain to match a predetermined value. The setting of metallized links in the trimmable resistors 480, 484, 486, 488, 490 disconnects them from the network to prevent additional alternate output terminals 442, 446, 448, 449, or 404 from being coupled to the output OUT of ROUT circuit 320 and providing additional resistance in parallel with resistor 408 and trimmable resistor 482 when output 444 is being used.

Trimmable resistors 480, 484, 486, 488, 490 include similar trimmable resistive sections and link sections. For example, trimmable resistor 480 is similar to the trimmable resistor 482 except that link 404B and 404C linked to the XMO option is now linked to the YMO metallization option.

A high resistance signal path through ROUT 320 increases the effective feedback resistance increasing the gain of the fixed gain operational amplifier circuit 300. One example of a high gain is when AV=10 in row 371 of table 368 of FIG. 3B. When AV=10, the VMO link options are closed. The closing of the VMO link in each of link sets 432, 424, 428, and 436 inserts more resistors between the input terminal 402 and the output terminal 449 resulting in a higher resistance of ROUT. At lower values of resistance such as when AV equals three, the VMO links are not closed. At AV=3, XMO links are closed as indicated in row 373 of table 368. Link sets 428 and 432 do not include XMO links. XMO links appear in link set 424. Thus, the effective resistance between the input terminal 402 and an output terminal 404 is resistor set 408 and trim resistors adjusted for gain accuracy. (Because additional output terminal 444 is electrically coupled to output terminal 404.) In general, lower gain implementations of circuit 300 utilize fewer resistor sets in ROUT 320 between input terminal 402 and output terminal 404. The unused resistors are disconnected from the circuit in order to reduce parasitic capacitances.

A second signal path connects the input INN of ROUT 320 to the output OUT of ROUT. The second signal path includes a path through one or more of capacitors 452, 454, 456, 458, 460, 462 as illustrated in FIG. 4A. The selection of a capacitor between INN terminal 450 and the output terminal 464 is determined by corresponding link pairs, 466, 468, 470, 472, 474, 476. The capacitor selected is thus determined by the gain range selected and is chosen to optimize the bandwidth or frequency response of the fixed gain operational amplifier 300.

Figure 5:
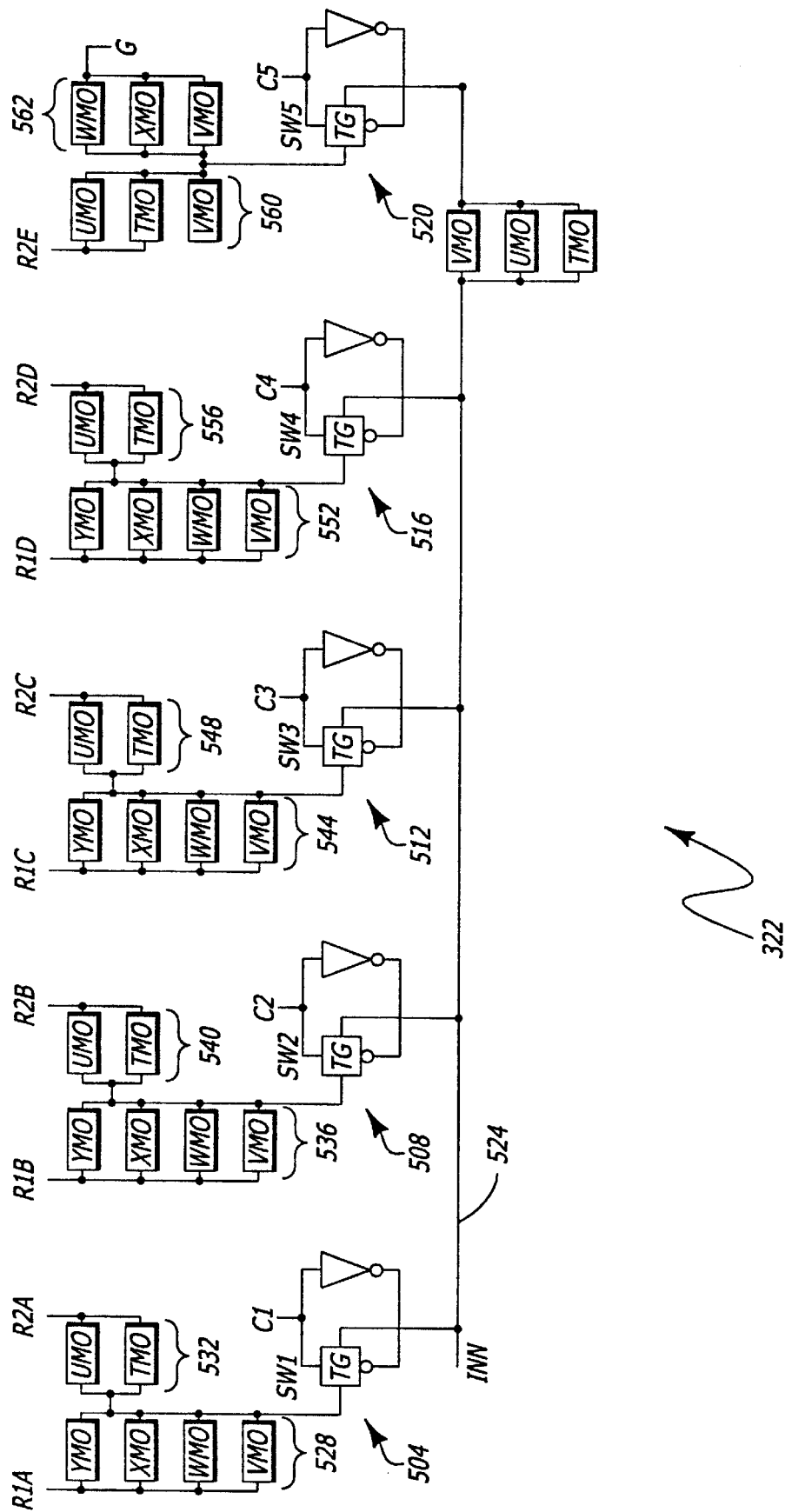
FIG. 5 illustrates a switch circuit (RMUX) for use in the circuit of FIGS. 3A–3B.

FIG. 5 illustrates an implementation of switch network RMUX 322 of FIG. 3A. RMUX 322 is a switch circuit which is controlled by multiplexer circuit MUX 312 through lines C1, C2, C3, C4 and C5. The setting of the multiplexer 312 controls switches 504, 508, 512, 516, 520 of FIG. 5. Opening and closing switches 504, 508, 512, 516, 520 determines which pairs of lines (R1A, R2A); (R1B, R2B); (R1C, R2C); (R1D, R2D); and (R1E, R2E) can be coupled to INN line 524 of RMUX 322. Metallized links will be used to select one line from the pair of lines to couple to INN line 524. For example, multiplexer line C2 controls switch 508. Switch 508 determines whether lines R1B and R2B are coupled to the INN line 524.

Link sets determine which line in the pair of lines is coupled to INN line 524. For example, whether line R1B or line R2B is coupled to INN line 524 when switch 508 is closed depends on which link set 536, 540 includes a closed link. Thus, whether a particular line, R1A, R2A, R1B, R2B, R1C, R2C, R1D, R2D, R2E is coupled to INN line 524 depends on two factors: (1) whether a corresponding link in link sets 528, 532, 536, 540, 544, 548, 552, 556, 560, 562 include a closed link; and (2) whether the corresponding switches 504, 508, 512, 516, 520 are open and closed. The setting of the link sets, such as link sets 528, 532 are set during the manufacturing process. The setting of the switches is controlled by a multiplexer such as MUX 312 of FIG. 3B. In one embodiment of the invention, MUX 312 is set by laser trimming.

Figure 6:
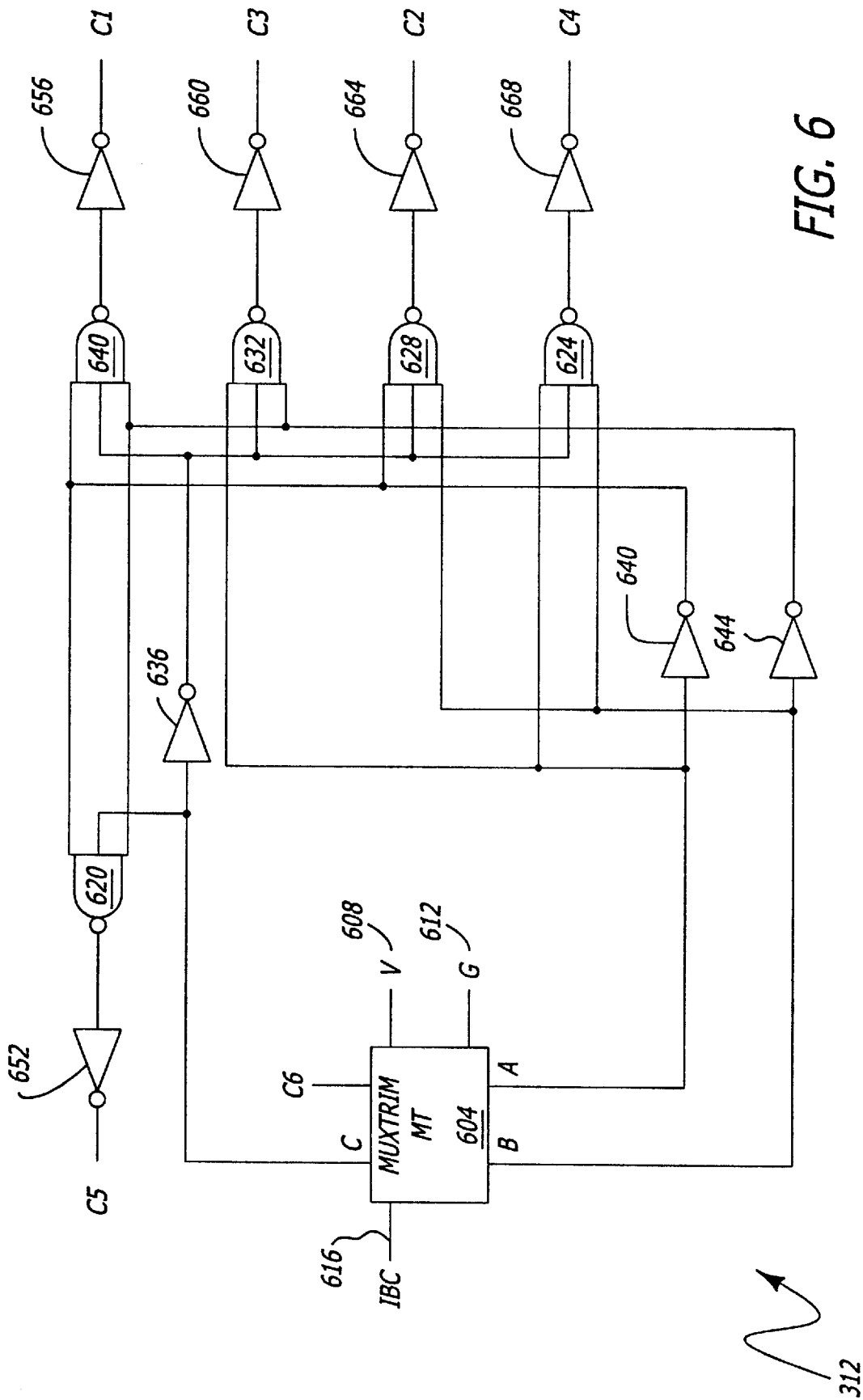
FIG. 6 illustrates the logic gates associated with a multiplexer (MUX) for use in the circuit of FIGS. 3A–3B.

FIG. 6 illustrates an implementation of MUX 312, including logic gates coupled to a multiplexer trim circuit 604. MUX 312 is used to control switches of RMUX 322. The multiplexer trim circuit 604 is further described in FIG. 7. In FIG. 6, the multiplexer trim circuit 604 outputs output control signals along line A, line B and line C. Each output line of MUX trim circuit 604 along lines A, B, and C is coupled to the input of at least one NAND gate such as NAND gate 620, 624, 628, 632 as well as at least one inverter such as inverter 636, 640, 644. The output of each inverter 636, 640, 644 is coupled to the input of at least one NAND gate such as NAND gate 620, 640, 632, 628, 624. The output of each NAND gate is inverted respectively by output inverters 652, 656, 660, 664, 668. Output inverters 652, 656, 660, 654, 668 output the MUX control signals used to control the switches of the MUX switch network along lines C1, C2, C3, C4, C5. The MUX control signals depend on the output of the MUX trim circuit 604. In one embodiment of the invention, the output of the MUX trim circuit 604 is set such that only one MUX control signal output along lines C1, C2, C3, C4, C5 may be asserted at a particular point in time. The C6 line is used to set a V/2 bias on the positive input terminal.

Figure 7:
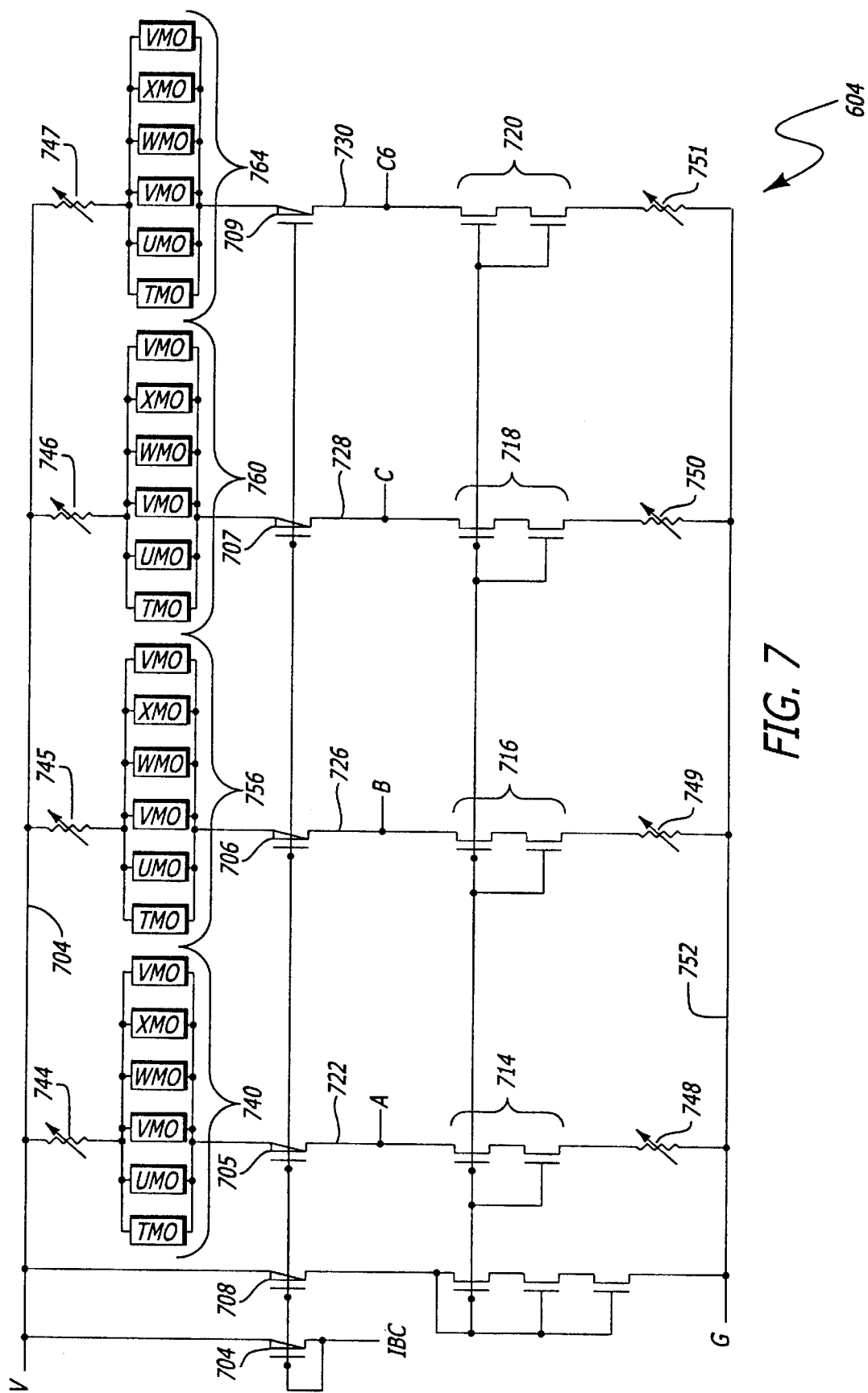
FIG. 7 illustrates a multiplexer trim circuit for use in the multiplexer of FIG. 6.

FIG. 7 illustrates one implementation of the MUX trim circuit 604 used in the MUX 312 of FIG. 6. In FIG. 7, a transistor 704 of multiplexer trim circuit receives a bias signal along the IBC line. Transistor 704, 705, 706, 707, 708, 709 form a current mirror. Transistor 708 biases transistor 710 and 712 which forms a lower current mirror with the MOSFET pairs 714, 716, 718, and 720. The gate voltage applied to transistors 710, 712 is also applied to the gates of transistors in transistor sets 714, 716, 718 and 720 turning them on. Switching on a transistor set results in current flow through corresponding lines 722, 726, 728, 730. In the default condition, when transistors sets 714, 716, 718 and 720 are on, the ratio of currents in the current mirrors formed by transistors 710, 712, 714, 716, 718, 720 forces control lines A, B, C, and C6 low.

Whether terminal A, B, C, and C6 is high or low depends on two factors (1) the trim settings of trim resistors 744, 745, 746, 747, 748, 749, 750, and 751 and (2) the link settings of link sets 740, 756, 760 and 764. The link sets are set during the metallization process to determine general gain ranges. Particular gains within the general range are determined by setting trim resistors. In one embodiment of resistor trimming, trim resistors 744, 745, 746, 747, 748, 749, 750, and 751 are thin film resistors which may have a large or small resistance. The resistance may be set with a laser during wafer sort.

In one embodiment of the invention, trim resistors 744, 745, 746, 747, 748, 749, 750, and 751 are thin film resistors which are typically set to a value of 4k Ohms before trimming, and 2M Ohms after trimming. Setting a resistance to a high value simulates an open circuit, while setting the trimmable resistance to a low value simulates a closed circuit. In the illustrated embodiment, the output of the multiplexer is primarily controlled by the setting of the trim resistors, because the link sets included are closed for every gain setting except an open-loop gain, however, other embodiments of the invention are possible in which the output of the multiplexer is primarily controlled by metallization techniques.

In order to better understand the operation of the circuit, the circuit setting the output of terminal A 722 will be described. When trim resistor 744 is set to a large value, for example 2M Ohms, or when all links in link set 740 which couples line 722 through resistor 744 to voltage rail line V 780 are open, line 722 is not connected (or connected through a very large resistance) to voltage rail line 780. Resistor 748 and transistor 714 couples terminal A to ground line G 752. Thus, when trim resistor 744 is a large value or when every link in link set 740 is open, the output of terminal A is low, to provide a deasserted signal.

In the example when trimmable resistor 744 is set at a low value, trimmable resistor 748 is set to a high resistance and at least one link in link set 740 is closed, terminal A is coupled to the voltage rail line 780 through trimmable resistor 744 resulting in a high or asserted signal at terminal A. Whether (1) trim resistor 744 is trimmed link high value or a low value (2) whether link set 740 includes at least one closed link and (3) whether trim resistor 748 is set to a low or high resistance determines whether terminal A is asserted or deasserted. Similarly, the voltage output by terminal B 726 is controlled by trim resistor 745, trim resistor 749, and link set 756; the voltage of terminal C 728 is controlled by trim resistor 746, trim resistor 750 and link set 760; and the voltage of terminal C6 730 is controlled by trim resistor 747, trim resistor 751 and link set 764.

Thus, during the manufacturing process, the outputs of the multiplexer trim circuit 604 is set by trimming resistors 744, 745, 746, 747, 748, 749, 750, 751 and setting links in link set 740, 756, 760, 764. The output of the MUX trim circuit 604 determines the output of MUX 312 along lines C1, C2, C3, C4, C5. The output of MUX 312 controls switches in the RMUX circuit 322 that determine the circuit path through RNET1 324 and RNET2 326. The circuit path determines which resistors in the RNET1 324 and RNET2 326 are gain resistors and which resistors serve as feedback resistors thereby controlling the gain of fixed gain op-amp circuit 300.

Figure 8:
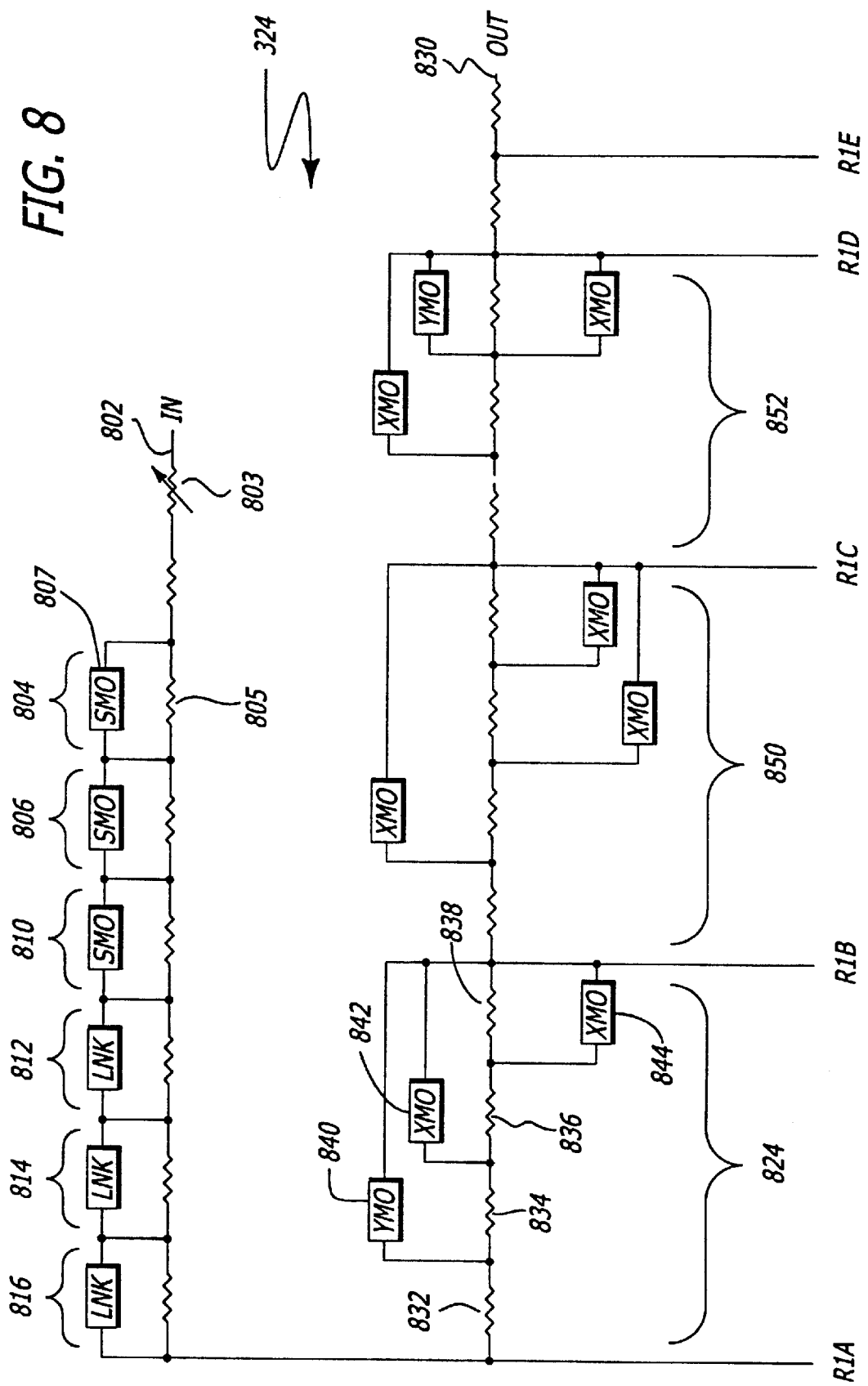
FIG. 8 illustrates a resistive network (RNET1) for use in the circuit of FIGS. 3A–3B.
Figure 9:
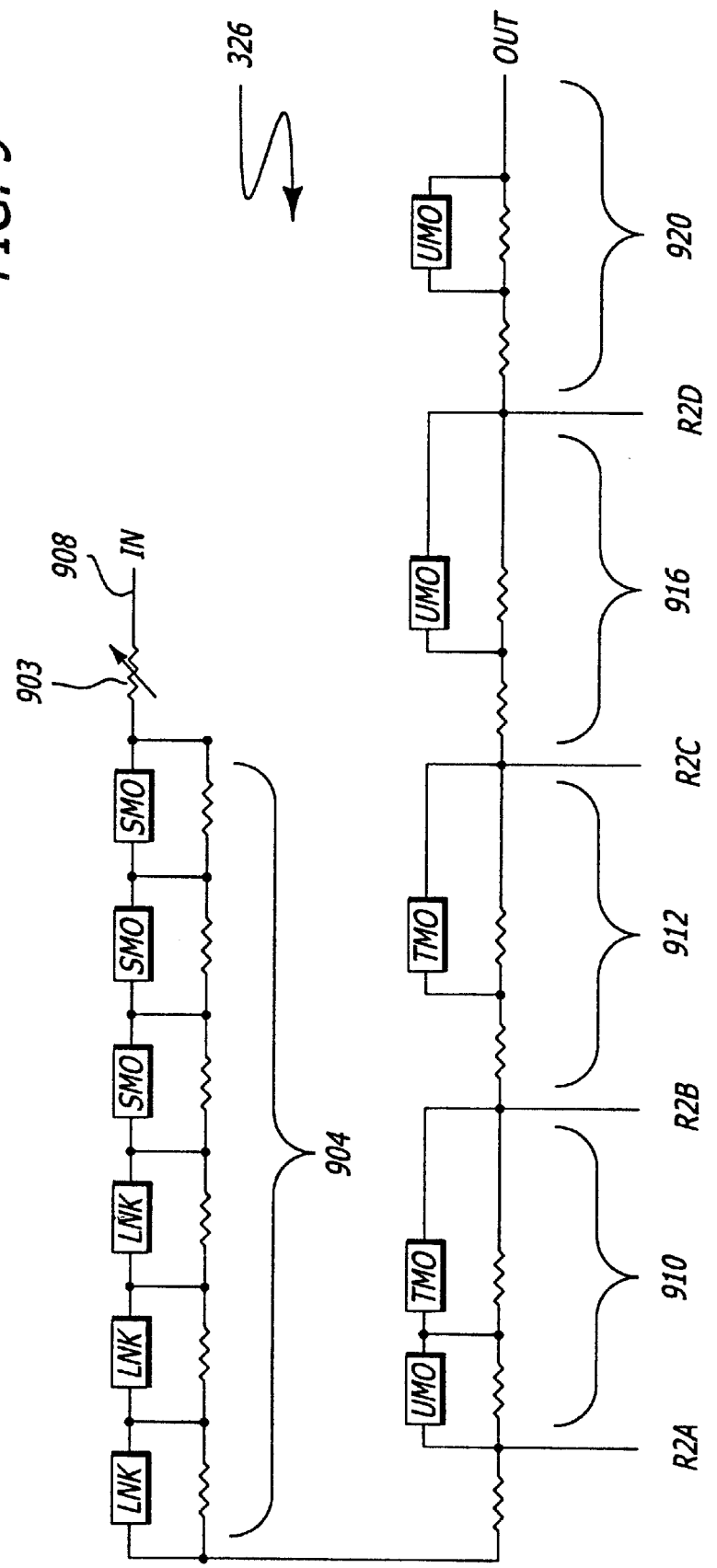
FIG. 9 illustrates a resistive network (RNET2) for use in the circuit of FIGS. 3A–3B.

FIG. 8 illustrates one embodiment of the RNET1 324 while FIG. 9 illustrates one embodiment of the RNET2 326. The structure of the two RNET circuits 324, 326 are very similar. The main difference being that different resistance values and different links are used.

In FIG. 8, the RNET1 circuit 324 receives the input signal to be amplified on input terminal 802 of FIG. 8. A trimmable resistor 803 couples the input terminal 802 to the remainder of the RNET circuit. In one embodiment, the trimmable resistor is a thin film resistor which is laser trimmable to set a resistance. A structure similar to the trimmable resistor structure of FIG. 4B without links 404B may be used. The adjustment of trimmable resistor 803 allows minor adjustments in gain to reach a predetermined gain value.

A set of links and resistors in parallel, for example, resistor link set 804 allows a circuit designer to mask out resistor 805 by closing link 807 connected in parallel with resistor 805. Resistors in resistor link sets 804, 806, 810, 812, 814, 816 always serve as gain resistors. The SMO links in the circuit are provided for illustration of alternate designs. In one embodiment of the invention, SMO links are all open.

When a high effective feedback resistance and a low effective gain resistance is desired, RMUX 322 selects the circuit path with the fewest resistors between the input terminal 802 and the input of op-amp core 304. In the illustrated embodiment, line R1A provides the lowest resistance circuit path between input terminal 802 and the input of op-amp core 304. Thus, in high gain applications, a switch in RMUX 322 is closed to couple line R1A to the INN terminal of RMUX 322. The INN terminal of RMUX 322 is coupled to an input of op-amp core 304. When lower gains are desired, other lines such as line R1B may be coupled to the input of op-amp core 304. Coupling line R1B instead of line R1A to the op-amp core input adds resistor set 624 to the effective gain resistance and subtracts the resistors in resistor set 824 from the effective feedback resistance.

Each resistor set, such as resistor set 824, includes a plurality of resistors 832, 834, 836, 838 coupled together in a series. Resistors or segments of a resistor set, such as resistors 834, 836, 838 are coupled in parallel with corresponding metallized links such as links 840, 842, 844. These resistors may be removed from the resistor network by "shorting" them out. Shorting out a resistor involves closing links connected in parallel with the resistor. For example, closing link 840 removes resistors 834, 836, 838 from the resistor network. The opening and closing of links is set during the circuit manufacturing process. By selectively removing resistors during the manufacturing process, the effective gain resistance and effective feedback resistance may be set to a desired value. The operation of resistor set 824 is approximately repeated in resistor set 850, 852. Each resistor set includes different links which may be set to achieve a different gain for the op-amp circuit.

FIG. 9 illustrates an implementation of RNET2 326 of FIG. 3A. RNET2 326 includes a trimmable resistor 903 which may be laser trimmed to allow minor adjustments in gain. The structure of trimmable resistor 903 is similar to the structure of trimmable resistor 803 as described in FIG. 8, RNET2 326 includes a resistor link set 904 having a series of resistors which is similar to the resistor link sets 804, 806, 810, 812, 814, 816 of FIG. 8. RNET2 326 also includes different circuit paths to link input terminal 908 to the input of op-amp core 304. By selecting lines R2A, R2B, R2C and R2D, the circuit path through RNET2 326 is chosen. Thus, by adjusting which circuit path is used to couple to the input 362 of the op-amp core 304 and selecting which resistors in resistor link sets 904, 910, 912, 916, 920 are shorted out, the effective gain resistances and the effective feedback resistances may be set.

Figure 10:
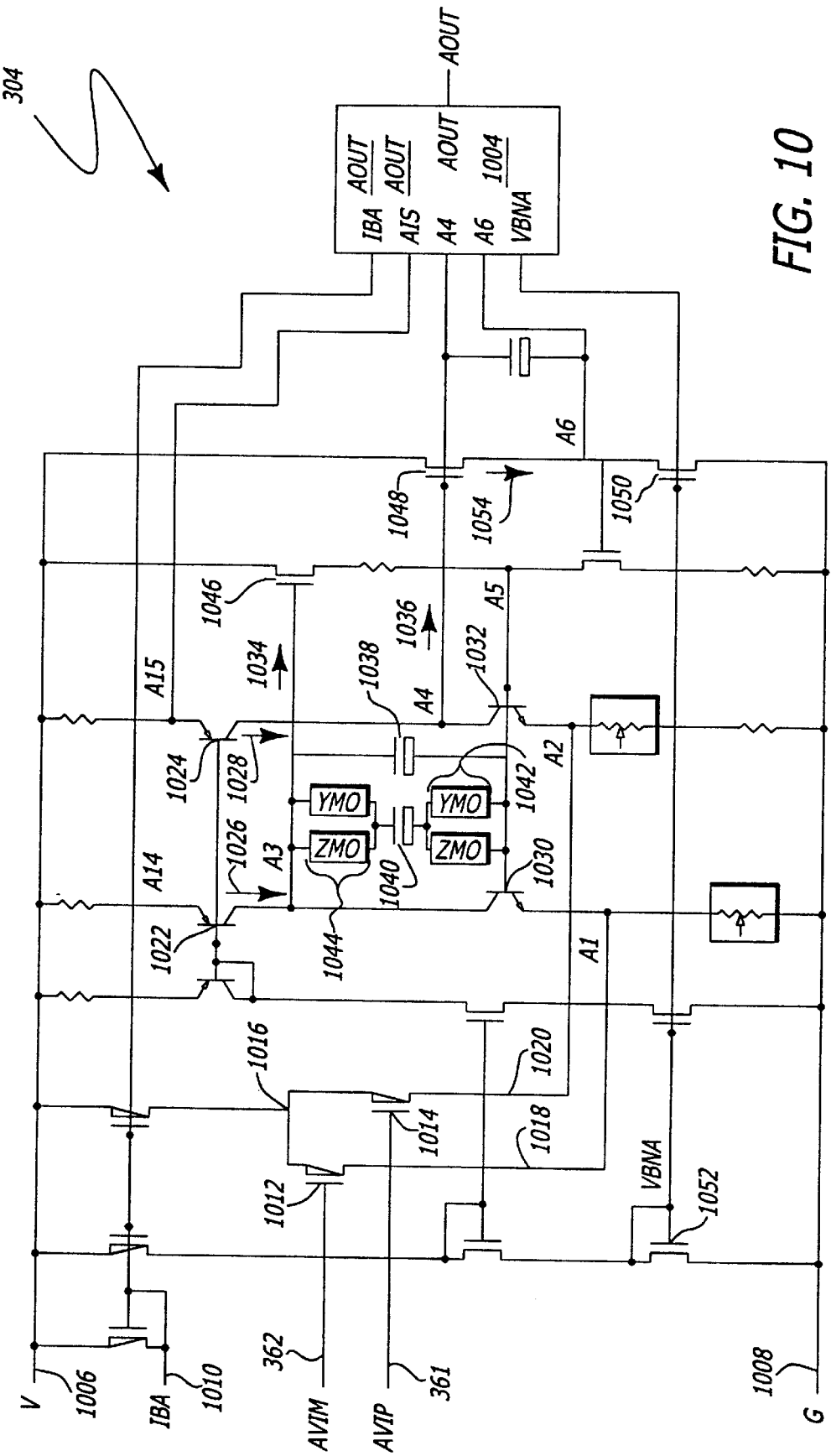
FIG. 10 illustrates an operational amplifier core (op-amp core) for use in the circuit of FIGS. 3A–3B.
Figure 11:
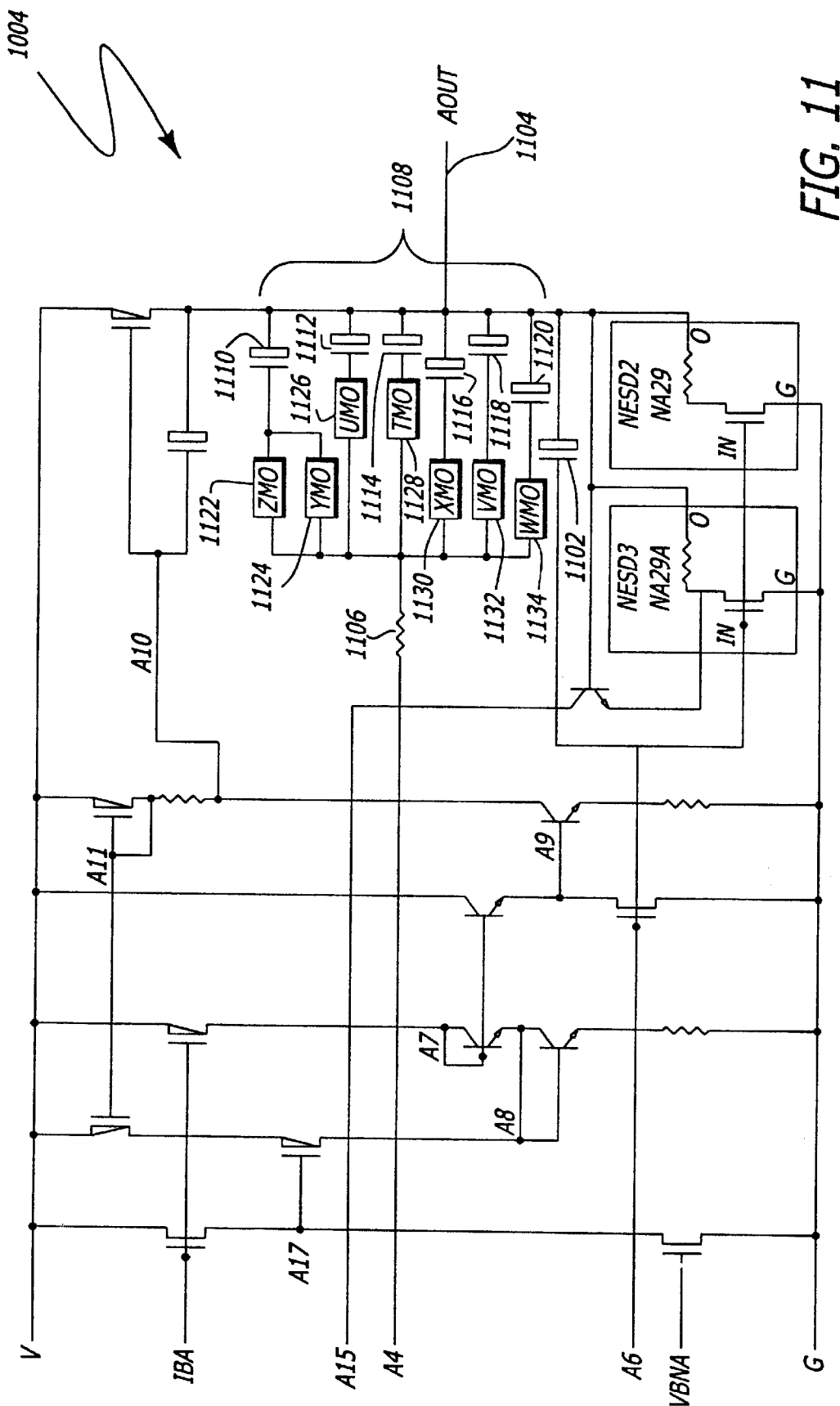
FIG. 11 illustrates an operational amplifier output stage for use in the circuit of FIG. 10.

One embodiment of an Op-amp core 304 is described in a patent application entitled Gain Enhancement for Operational Amplifiers, by Madhav V. Kolluri, application Ser. No. 09/010,467 and hereby incorporated by reference. FIGS. 10 and 11 also represents an example of the circuitry used to fabricate an op-amp core 304 of FIG. 3B. Op-amp core 304 includes an output stage AOUT 1004 illustrated in FIG. 11 coupled to the circuitry illustrated in FIG. 10. In FIG. 10, the power supply is coupled to voltage rail V 1006 and ground line G 1008. The bias signal IBA from bias circuit 310 of FIG. 3B is coupled into input terminal 1010 of FIG. 10.

Op-amp core 304 in FIG. 10 amplifies a voltage difference between positive input terminal 361 and negative input terminal 362. The negative input terminal 362 is coupled to a gate of transistor 1012 while the positive input terminal 361 is coupled to the gate of transistor 1014. In the illustrated embodiment, transistors 1012 and 1014 are field effect transistors (FET).

The source terminal of transistors 1012 and 1014 are coupled to a common voltage at terminal 1016. Transistors 1012 and 1014 are selected to have identical dimensions.

Thus, the difference in voltage applied to the gate of transistor 1012 and the gate of transistor 1014 determines the relative distribution of current between the two transistors along lines 1018 and 1020.

Transistor 1022 and transistor 1024 form a current mirror such that the current flowing through transistor 1022 and the current flowing transistor 1024 are the same. In the illustrated embodiment, transistors 1022 and 1024 are bi-polar junction transistors (BJT) although other transistors may be used. Thus, the current flowing through line 1026 is the same as the current flowing through line 1028. The bases of BJT transistors 1030 and 1032 are also coupled together. Thus, the difference in current flowing through transistors 1030 and 1032 is a function of the difference in base-emitter voltage of transistor 1030, 1032. The differential voltage between negative input 362 and positive input 361 which is translated into differential currents through lines 1018 and 1020 determines the difference in the base-emitter voltage of transistors 1030 and 1032.

To illustrate how the currents through 1018 and 1020 determines the current flowing through transistors 1030 and 1032 assume a high voltage is applied to negative input terminal 362 producing a large current flowing through line 1018 relative to line 1020. The large current raises the voltages A1 (emitter of transistor 1030) relative to A2 (emitter of transistor 1032) resulting in less current flowing through transistor 1030 than transistor 1032. Thus, the difference in currents flowing through transistors 1030 and 1032 is a function of the difference in input voltages at negative input 362 and positive input 361.

The current mirror formed by transistor 1022 and transistor 1024 results in a common current along lines 1026 and 1028, thus the current in lines 1034 and line 1036 indicate the difference in current through transistors 1030 and transistor 1032. The difference in currents in line 1034 and line 1036 is a function of the difference in voltage between negative input terminal 362 and positive input terminal 361.

Internal compensation capacitors 1038, 1040 couple line 1034 to the bases of transistors 1030, 1032. The internal compensation capacitors 1038, 1040 may be adjusted depending on the desired gain using link sets 1042, 1044. In the illustrated embodiment, compensation capacitor 1040 is coupled only when link sets 1042 and link set 1044 includes at least one connected link. The link sets 1042, 1044 coupling capacitor 1040 allows adjustment of the internal op-amp compensation to optimize the bandwidth at a particular gain.

Line 1034 is coupled to the gate of transistor 1046 while line 1036 is coupled to the gate of transistor 1048. Thus, the currents flowing through transistor 1046 and transistor 1048 are a function of the difference in currents flowing in lines 1034, 1036. A current mirror formed by transistor 1050 and transistor 1052 fixes the current flowing through transistor 1050. Current through line 1036 reflects the voltage difference of the op-amp core inputs and controls current through line 1054. Current in excess of the fixed current through transistor 1050 is input into A6 terminal of output stage AOUT 1004.

FIG. 11 illustrates one implementation of a circuit output stage AOUT 1004. The signal received at terminal A6 propagates through capacitor 1102 to an output terminal 1104 of the op-amp core 304. The current from line 1036 of FIG. 10 is received by the A4 terminal of the output stage AOUT 1004 and transferred through resistor 1106 to capacitor bank 1108. Capacitor bank 1108 includes a plurality of capacitors 1110, 1112, 1114, 1116, 1118, 1120 coupled to a plurality of links 1122, 1124, 1126, 1128, 1130, 1132, 1134. By opening and closing a link, the corresponding capacitor connected in series with the link may be removed from the circuit. For example, opening link 1130 removes capacitor 1116 from the circuit. Capacitor bank 1108 allows customization of the compensation capacitance to correspond to the gain selected and optimize the bandwidth or frequency response of the op-amp circuit including the feedback loop.

Figure 12:
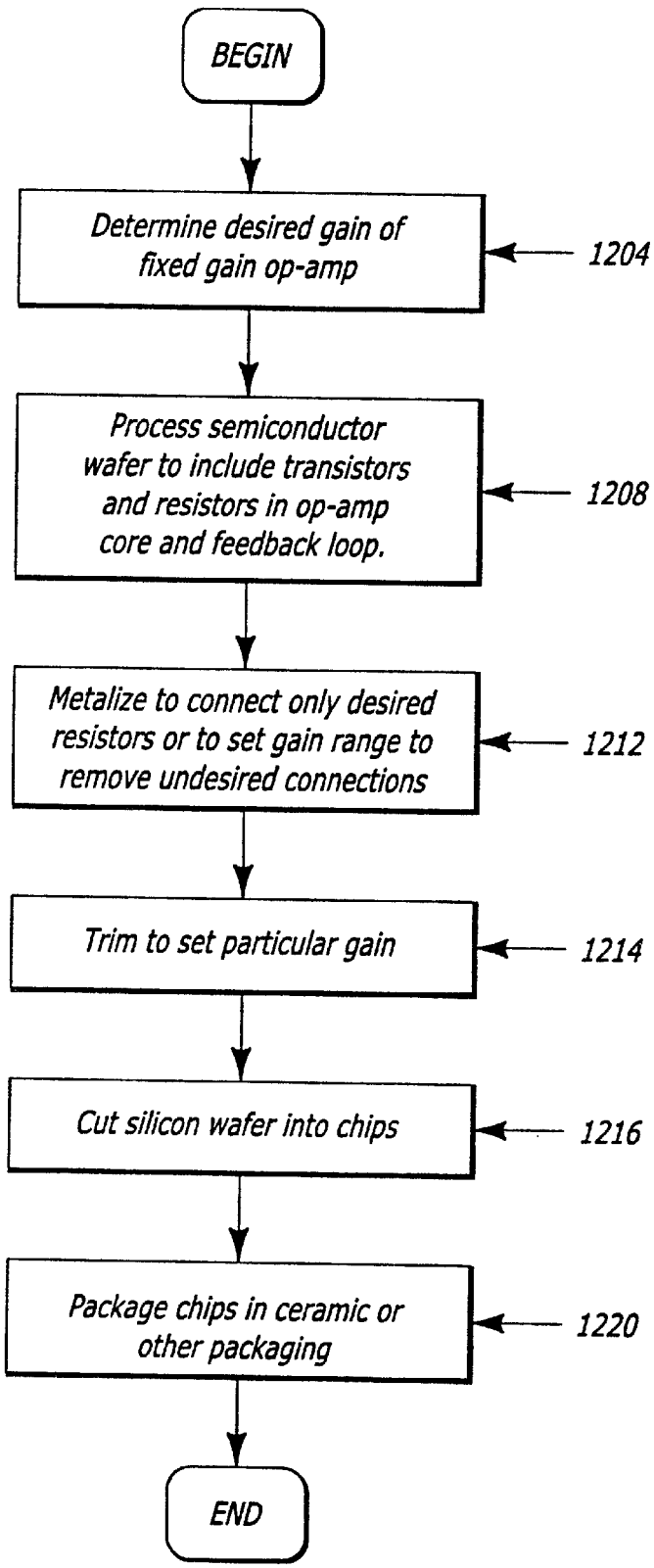
FIG. 12 is a flow diagram illustrating the processes used to fabricate a fixed gain operational amplifier circuit.

FIG. 12 is a flowchart illustrating one embodiment of fabricating an amplifier circuit including an op-amp core and a gain control network on a single silicon chip. In block 1204, the gain of the fixed gain op-amp is determined. A standardized masking is then used to process the semiconductor wafer to include transistors and resistors needed to form an op-amp core and associated gain control network in block 1208. The gain control network includes a plurality of links used to connect resistances in the gain control network.

The links may be processed using one of several methods. In one method described in block 1212, metallization is used to connect selected links to set an effective feedback resistance and effective gain resistance. In an alternate embodiment, trimmable resistors are used to implement the links which allow laser trimming processes to set selected links. Depending on the type of link (anti-fuse, trimmable resistor), the laser may be used to connect or disconnect links and determine links in block 1212. After setting links in block 1212, the resistance of trimmable resistors is set in block 1214 to achieve a particular gain. In one embodiment, the trimmable resistors are trimmed using a laser during wafer sort. After processing of wafer is complete, the silicon wafer may be cut to form individual chips in block 1216. These chips may be packaged in a semi-conductor package such as a ceramic or plastic integrated circuit package in block 1220. Pins extend from the integrated circuit package for connections to external circuitry. Such packaging techniques are well understood by those of ordinary skill in the art. The fabrication of the entire fixed gain operational amplifier on a single chip allows for miniaturization of circuits and the use of trimmable resistors and/or links throughout the circuit to allow simple customization of gain parameters during chip processing.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A factory selectable closed loop fixed gain amplifier circuit comprising:
    an integrated circuit chip including:
        an operational amplifier core; and
        a gain control network coupled to the operational amplifier core, the gain control network including a feedback path to feed an output of the operational amplifier core to an input of the operational amplifier core, the gain control network including factory selectable links to select a fixed closed loop gain of the closed loop fixed gain amplifier circuit from a plurality of closed loop gains prior to packaging of the integrated circuit chip into an integrated circuit package.

2. A closed loop fixed gain amplifier circuit comprising:
    an integrated circuit chip including:

an operational amplifier core; and a gain control network including a feedback path to feed an output of the operational amplifier core to an input of the operational amplifier core, the gain control network including switchable links to select a fixed gain of the closed loop-amplifier gain amplifier circuit from a plurality of gains prior to packaging the integrated circuit chip into an integrated circuit package wherein the switchable links are metallizations set to disconnect resistors which are not necessary to select the gain.

3. The closed loop fixed gain amplifier circuit of claim 2 wherein the gain control network includes trimmable resistors which are laser trimmed to set the closed loop gain.

4. A closed loop fixed gain amplifier circuit comprising:

an integrated circuit chip including:

an operational amplifier core; and a gain control network including a feedback path to feed an output of the operational amplifier core to an input of the operational amplifier core, the gain control network including switchable links to select a fixed gain of the closed loop-amplifier gain amplifier circuit from a plurality of gains prior to packaging the integrated circuit chip into an integrated circuit package wherein the gain control circuit includes a multiplexer, the multiplexer including trimmable resistors set prior to packaging of the integrated circuit chip to select the gain of the closed loop-amplifier circuit.

5. The closed loop fixed gain amplifier circuit of claim 4 wherein the gain control network includes a switch network including switches controlled by the multiplexer, the setting of the switches to select a feedback path from a plurality of feedback paths in the gain control network.

6. The closed loop fixed gain amplifier circuit of claim 4 wherein the trimmable resistors in the multiplexer are laser trimmed prior to the packaging of the circuit chip.

7. The closed loop fixed gain amplifier circuit of claim 4 further comprising:

a bias circuit controlled by the multiplexer, the bias circuit to supply half the power supply voltage to a second input of the operational amplifier core.

8. The closed loop fixed gain amplifier circuit of claim 1 wherein the gain control network includes a plurality of capacitors coupled to corresponding link sets, each link in the link set adjusted to improve the frequency response of the closed loop fixed gain amplifier circuit.

9. A closed loop fixed gain amplifier circuit comprising:

an integrated circuit chin including:

an operational amplifier core; and a gain control network including a feedback path to feed an output of the operational amplifier core to an input of the operational amplifier core, the gain control network including switchable links to select a fixed gain of the closed loop-amplifier gain amplifier circuit from a plurality of gains prior to packaging the integrated circuit chip into an integrated circuit package wherein the operational amplifier core includes a plurality of capacitors coupled to switchable metallization links, the metallization links set according to the selected gain.

10. A method of fabricating a factory selectable closed loop fixed gain amplifier on a silicon chip comprising:

fabricating an op-amp core on the silicon chip;

fabricating a gain control network coupling an output of the op-amp core to an input of the op-amp core; and setting the gain control network to set a fixed closed loop gain of the closed loop fixed gain amplifier prior to packaging of the silicon chip.

11. A method of fabricating a closed loop fixed gain amplifier on a silicon chip comprising:

fabricating an op-amp core on the silicon chip;

fabricating a gain control network coupling an output of the op-amp core to an input of the op-amp core and setting metallization links connected in parallel with resistors to remove unnecessary resistors from the circuit; and setting the gain control network to set a gain of the closed loop-amplifier to a fixed gain prior to packaging of the chip.

12. A method of fabricating a closed loop fixed gain amplifier on a silicon chip comprising:

fabricating an op-amp core on the silicon chip;

fabricating a gain control network coupling an output of the op-amp core to an input of the op-amp core, fabricating a multiplexer to control switches in the gain control network, the switches set by the multiplexer to select a feedback path from a plurality of feedback paths in the gain control network to couple the output of the op-amp core to the input of the op-amp core; and setting the gain control network to set a gain of the closed loop-amplifier to a fixed gain prior to packaging of the silicon chip.

13. The method of claim 12 wherein the output of the multiplexer is set by trimming trimmable resistors in the multiplexer.

14. A method of fabricating a closed loop fixed gain amplifier on a silicon chip comprising:

fabricating an op-amp core on the silicon chip;

fabricating a gain control network coupling an output of the op-amp core to an input of the op-amp core;

setting the gain control network to set a gain of the closed loop-amplifier to a fixed gain prior to packaging of the silicon chip; and setting metallization links in the op-amp core to improve the frequency response of the closed loop fixed gain amplifier, the links set according to a gain range of the closed loop fixed gain amplifier.

15. The method of fabricating a closed loop fixed gain amplifier on a silicon chip comprising:

fabricating an op-amp core on the silicon chip;

fabricating a gain control network coupling an output of the op-amp core to an input of the op-amp core;

setting the gain control network to set a gain of the closed loop-amplifier to a fixed gain prior to packaging of the silicon chip; and setting metallization links coupled to capacitors in the gain control network to optimize the frequency response according to a gain range of the closed loop fixed gain amplifier.

16. A closed loop amplifier circuit with factory selectable feedback paths, feedback resistance and input resistance, the closed loop amplifier circuit comprising:

an op-amp core including an output terminal, a first input terminal and a second input terminal;

a plurality of factory selectable feedback paths for coupling the output terminal to at least one input terminal of the op-amp core, the plurality of factory selectable feedback paths including a first resistor network and a first section of a second resistor network for setting a factory selectable feedback resistance between the output terminal and the at least one input terminal of the op-amp core;

a factory selectable input resistance coupled between an input of the amplifier circuit and the at least one input terminal of the op-amp core, the factory selectable input resistance including a second section of the second resistor network; and a factory selectable switch circuit including factory selectable links which are set at the factory prior to packaging the closed loop amplifier circuit into an integrated circuit package, the factory selectable switch circuit coupled to the plurality of factory selectable feedback paths and the factory selectable input resistance to select a feedback path from the plurality of factory selectable feedback paths, the selecting of the feedback path to determine whether at least one resistor in the second resistor network is included in the factory selectable input resistance or the feedback resistance in the feedback path to select a fixed closed loop gain prior to packaging the closed loop amplifier circuit into an integrated circuit package.

17. An amplifier circuit comprising:

an op-amp core including an output terminal, a first input terminal and a second input terminal;

a plurality of possible feedback paths coupling the output terminal to at least one input terminal, the possible feedback paths including a first resistor network and a first section of a second resistor network;

a gain resistance coupled between an input of the amplifier circuit and the at least one input terminal of the op-amp core, the gain resistance including a second section of the second resistor network; and a switch circuit to select a selected feedback path from the plurality of possible feedback paths, the selecting of the feedback path to determine whether at least one resistor in the second resistor network is included in the gain resistance or the feedback resistance wherein the switch circuit is controlled by a multiplexer circuit.

18. The amplifier circuit of claim 16 wherein the first resistor network includes a plurality of links set during fabrication of the amplifier circuit to select a closed loop gain range from a plurality of closed loop gain ranges.

19. An amplifier circuit comprising:

an op-amp core including an output terminal, a first input terminal and a second input terminal;

a plurality of possible feedback paths coupling the output terminal to at least one input terminal, the possible feedback paths including a first resistor network including a plurality of links set during fabrication of the amplifier circuit to select a gain range from a plurality of gain ranges and a trimmable resistor trimmed to set the resistance of the first resistor network and including a first section of a second resistor network;

a gain resistance coupled between an input of the amplifier circuit and the at least one input terminal of the op-amp core, the gain resistance including a second section of the second resistor network; and a switch circuit to select a selected feedback path from the plurality of possible feedback paths, the selecting of the feedback path to determine whether at least one resistor in the second resistor network is included in the gain resistance or the feedback resistance.

20. An amplifier circuit comprising:

an op-amp core including an output terminal, a first input terminal and a second input terminal;

a plurality of possible feedback paths coupling the output terminal to at least one input terminal, the possible feedback paths including a first resistor network including a plurality of links set during fabrication of the amplifier circuit to select a gain range from a plurality of gain ranges and a first section of a second resistor network, the second resistor network including a trimmable resistor to set the resistance of the second resistor network;

a gain resistance coupled between an input of the amplifier circuit and the at least one input terminal of the op-amp core, the gain resistance including a second section of the second resistor network; and a switch circuit to select a selected feedback oath from the plurality of possible feedback paths, the selecting of the feedback path to determine whether at least one resistor in the second resistor network is included in the gain resistance or the feedback resistance.

21. An amplifier circuit comprising:

an op-amp core including an output terminal, a first input terminal and a second input terminal;

a plurality of possible feedback paths coupling the output terminal to at least one input terminal, the possible feedback paths including a first resistor network and a first section of a second resistor network, the first resistor network including a plurality of capacitors coupled between the output terminal and the input terminal of the op-amp core, the plurality of capacitors connected in series with a plurality of metallization links to enable selection of capacitors to set a capacitance between the output terminal and the input terminal of the op-amp core;

a gain resistance coupled between an input of the amplifier circuit and the at least one input terminal of the op-amp core, the gain resistance including a second section of the second resistor network; and a switch circuit to select a selected feedback path from the plurality of possible feedback paths, the selecting of the feedback path to determine whether at least one resistor in the second resistor network is included in the gain resistance or the feedback resistance.

22. A closed loop fixed gain amplifier circuit having a factory selected predetermined closed loop range, the closed loop gain amplifier circuit comprising:

an integrated circuit chip including:
an operational amplifier core; and
a gain control network including a feedback path to feed an output of the operational amplifier core to an input of the operational amplifier core, the gain control network including factory selectable switchable links to set a closed loop gain of the closed loop fixed gain amplifier circuit to a predetermined closed loop gain range from a plurality of closed loop gain ranges prior to packaging of the integrated circuit chip at the factory into an integrated circuit package.

23. A closed loop fixed gain amplifier circuit comprising:

an integrated circuit chip including:
an operational amplifier core including a plurality of capacitors coupled to switchable metallization links, the metallization links set according to the selected gain range; and
a gain control network including a feedback path to feed an output of the operational amplifier core to an input of the operational amplifier core, the gain control network including switchable links to set a gain range of the closed loop-amplifier circuit to a predetermined gain range from a plurality of gain ranges prior to packaging of the circuit chip in an integrated circuit package.

* * * * *